(12) United States Patent
Kim

(10) Patent No.: US 10,311,816 B2
(45) Date of Patent: Jun. 4, 2019

(54) GATE DRIVING CIRCUIT AND DISPLAY DEVICE INCLUDING THE SAME

(71) Applicant: SAMSUNG DISPLAY CO., LTD., Yongin-si, Gyeonggi-do (KR)

(72) Inventor: Keunwoo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 15/240,971

(22) Filed: Aug. 18, 2016

(65) Prior Publication Data

US 2017/0162147 A1 Jun. 8, 2017

(30) Foreign Application Priority Data

Dec. 3, 2015 (KR) .......................... 10-2015-0171682

(51) Int. Cl.
*G09G 3/36* (2006.01)
*G11C 19/28* (2006.01)

(52) U.S. Cl.
CPC ......... *G09G 3/3655* (2013.01); *G09G 3/3607* (2013.01); *G09G 3/3688* (2013.01);
(Continued)

(58) Field of Classification Search
CPC .. G09G 3/3655; G09G 3/3688; G09G 3/3607; G09G 2310/027;
(Continued)

(56) References Cited

U.S. PATENT DOCUMENTS

2013/0076722 A1* 3/2013 Choi ...................... G09G 3/348
345/212
2014/0055436 A1* 2/2014 Han ..................... G09G 3/3696
345/211
(Continued)

FOREIGN PATENT DOCUMENTS

KR 10-2008-0056781 A 6/2008
KR 10-2011-0110502 A 10/2011
(Continued)

OTHER PUBLICATIONS

Kim, K. et al., Double-Gate CMOS: Symmetrical—Versus Asymmetrical-Gate Devices, IEEE Transactions on Electron Devices, Feb. 2001, pp. 294-299, vol. 48, No. 2, IEEE.
(Continued)

*Primary Examiner* — Srilakshmi K Kumar
*Assistant Examiner* — Brent D Castiaux
(74) *Attorney, Agent, or Firm* — Lewis Roca Rothgerber Christie LLP

(57) ABSTRACT

A gate driving circuit including a plurality of stages to respectively output gate signals to gate lines and connected to each other in cascade, an ith stage from among the plurality of stages including: a first output unit to generate a gate signal from a clock signal received at an input terminal; a first control unit to control the potential of a first node; a first pull-down unit to provide a first low voltage to a gate output terminal to drop down the gate signal, the first low voltage being lower than a gate off voltage of the gate signal; a first holding unit and a stabilization unit, each to provide a second low voltage having a higher level than that of the first low voltage to the gate output terminal; and a second control unit to control an operation of the first holding unit.

18 Claims, 9 Drawing Sheets

(52) U.S. Cl.
CPC ..... *G11C 19/28* (2013.01); *G09G 2300/0426* (2013.01); *G09G 2310/027* (2013.01); *G09G 2310/0286* (2013.01); *G09G 2310/08* (2013.01)

(58) Field of Classification Search
CPC ....... G09G 2310/0286; G09G 2310/08; G09G 2300/0426; G09G 2310/067; G09G 2310/0264; G11C 19/28
See application file for complete search history.

(56) References Cited

U.S. PATENT DOCUMENTS

2015/0002504 A1* 1/2015 Jo ..................... G09G 3/3677
345/213
2015/0077407 A1 3/2015 Kim et al.

FOREIGN PATENT DOCUMENTS

| KR | 10-2013-0004976 A | 1/2013 |
| KR | 10-2013-0142454 A | 12/2013 |
| KR | 10-2014-0094882 A | 7/2014 |
| KR | 10-2014-0112290 A | 9/2014 |
| KR | 10-1478667 B1 | 1/2015 |
| KR | 10-1587610 B1 | 1/2016 |
| KR | 10-2016-0042326 A | 4/2016 |

OTHER PUBLICATIONS

Liao, et al., Design of Integrated Amorphous-Silicon Thin-Film Transistor Gate Driver,; Journal of Display Technology, vol. 9, No. 1, Jan. 2013, pp. 7-16.

* cited by examiner

GATE DRIVING CIRCUIT AND DISPLAY DEVICE INCLUDING THE SAME

CROSS-REFERENCE TO RELATED APPLICATIONS

This application claims priority to and the benefit of Korean Patent Application No. 10-2015-0171682, filed on Dec. 3, 2015, in the Korean Intellectual Property Office (KIPO), the entire content of which is incorporated by reference herein in its entirety.

BACKGROUND

1. Field

One or more aspects of example embodiments of the present disclosure relate to a gate driving circuit and a display device including the same.

2. Description of the Related Art

A display device includes a plurality of gate lines, a plurality of data lines, and a plurality of pixels connected to the plurality of gate lines and the plurality of data lines. The display device includes a gate driving circuit for sequentially providing gate signals to the plurality of gate lines, and a data driving circuit for outputting data signals to the plurality of data lines.

The gate driving circuit includes a shift register formed of a plurality of stages connected in cascade to each other. Each of the plurality of stages includes a plurality of transistors that are operatively connected to each other to output a gate voltage to a corresponding gate line.

Recently, the resolution of a display device is increased from Full High Definition (FHD) that supports 1920×1080 resolution to Ultra High Definition (UHD) that supports 7680×4320 resolution (e.g., 8K) or 3840×2160 resolution (e.g., 4K), so that the resolution of the display device becomes larger.

The above information disclosed in this Background section is for enhancement of understanding of the background of the inventive concept, and therefore, it may contain information that does not constitute prior art.

SUMMARY

One or more aspects of example embodiments of the present disclosure provide a gate driving circuit for sufficiently obtaining a pixel charging time and for reducing a variation between charging rates between upper end pixels and lower end pixels of a display device, even if the resolution of the display panel is increased, and a display device including the same.

According to an example embodiment of the inventive concept, a gate driving circuit includes a plurality of stages configured to respectively output gate signals to gate lines and connected to each other in cascade, an ith stage from among the plurality of stages, where i is an integer greater than or equal to two, including: a first output unit configured to be turned on/off according to a potential of a first node, and to generate a gate signal from a clock signal received at an input terminal of the ith stage, the gate signal being outputted to a gate output terminal of the ith stage and including a gate on voltage and a gate off voltage; a first control unit configured to control the potential of the first node; a first pull-down unit configured to provide a first low voltage to the gate output terminal of the ith stage to drop down the gate signal of the ith stage, after the gate on voltage of the gate signal of the ith stage is outputted, the first low voltage being lower than the gate off voltage of the gate signal of the ith stage; a first holding unit and a stabilization unit, each configured to provide a second low voltage having a higher level than that of the first low voltage to the gate output terminal of the ith stage, after the first low voltage is provided to the gate output terminal of the ith stage; and a second control unit configured to control an operation of the first holding unit.

In an embodiment, the first pull-down unit may include a first pull-down transistor; and the first pull-down transistor may include a control electrode configured to receive an output signal of an i+1th stage, an input electrode configured to receive the first low voltage, and an output electrode connected to the gate output terminal.

In an embodiment, the first holding unit may include: a first holding transistor, and the first holding transistor may include a control electrode connected to a second node and configured to receive an inverter signal generated based on the clock signal from the second control unit, an input electrode configured to receive the second low voltage, and an output electrode connected to the gate output terminal.

In an embodiment, the stabilization unit may include: a stabilization transistor, and the stabilization transistor may include a control electrode configured to receive an output signal of an i+2th stage, an input electrode configured to receive the second low voltage, and an output electrode connected to the gate output terminal.

In an embodiment, the first low voltage may be more than about −15 V and less than about −10 V; and the second low voltage may be more than about −9V and less than about −6 V.

In an embodiment, the gate off voltage may have the same level as that of the first low voltage.

In an embodiment, the gate driving circuit may further include a second output unit configured to be turned on or off according to a potential of the first node, and to generate a carry signal to be outputted to a carry output terminal of the ith stage from a clock signal received at the input terminal of the ith stage.

In an embodiment, the gate driving circuit may further include a second pull-down unit configured to provide the first low voltage to the carry output terminal of the ith stage after the carry signal is outputted, and the second pull-down unit may include a second pull-down transistor.

In an embodiment, the gate driving circuit may further include a second holding unit configured to maintain the carry output terminal of the ith stage at the first low voltage after the first low voltage is provided to the carry output terminal of the ith stage, and the second holding unit may include a second holding transistor.

According to an example embodiment of the inventive concept, a display device includes: a display panel including a plurality of gate lines, a plurality of data lines crossing and insulated from the plurality of gate lines, and a plurality of pixels respectively connected to the gate lines and the data lines; a data driver configured to provide data signals to the plurality of data lines; and a gate driver including a plurality of stages connected in cascade with each other and configured to provide gate signals to the plurality of gate lines, an ith stage from among the plurality of stages, where i is an integer greater than or equal to two, including: a first output unit configured to be turned on/off according to a potential of a first node, and to generate a gate signal from a clock signal received at an input terminal of the ith stage, the gate signal being outputted to a gate output terminal of the ith stage and including a gate on voltage and a gate off voltage; a first control unit configured to control the potential of the first node; a first pull-down unit configured to provide a first low voltage to the gate output terminal of the ith stage to drop down the gate signal of the ith stage, after the gate on voltage of the gate signal of the ith stage is outputted, the first low voltage being lower than the gate off voltage of the gate signal of the ith stage; a first holding unit and a stabilization unit, each configured to provide a second low voltage having a higher level than that of the first low voltage to the gate output terminal of the ith stage, after the first low voltage is provided to the gate output terminal of the ith stage; and a second control unit configured to control an operation of the first holding unit.

In an embodiment, at least one pixel from among the plurality of pixels may include: a pixel transistor connected to a corresponding gate line and a corresponding data line; a pixel electrode connected to the pixel transistor; and a common electrode opposite the pixel electrode with a liquid crystal layer there between, wherein the pixel electrode and the common electrode may form a liquid crystal capacitor configured to be charged with a data voltage received from the pixel transistor.

In an embodiment, the data voltage may be a voltage corresponding to a gray level value of a corresponding data signal applied to the corresponding data line within a range of about −8 V to about 35 V.

In an embodiment, the first pull-down unit may include a first pull-down transistor; and the first pull-down transistor may include a control electrode configured to receive an output signal of an i+1th stage, an input electrode configured to receive the first low voltage, and an output electrode connected to the gate output terminal.

In an embodiment, the first holding unit may include a holding transistor, and the holding transistor may include a control electrode connected to a second node configured to receive an inverter signal generated based on the clock signal from the second control unit, an input electrode configured to receive the second low voltage, and an output electrode connected to the gate output terminal.

In an embodiment, the stabilization unit may include a stabilization transistor, and the stabilization transistor may include a control electrode configured to receive an output signal of an i+2th stage, an input electrode configured to receive the second low voltage, and an output electrode connected to the gate output terminal.

In an embodiment, the first low voltage may be more than about −15 V and less than about −10 V; and the second low voltage may be more than about −9V and less than about −6 V.

In an embodiment, the gate off voltage may have the same level as that of the first low voltage.

According to an example embodiment of the inventive concept, a gate driving circuit includes a plurality of stages configured to respectively output gate signals to gate lines and connected in cascade with each other, an ith stage from among the plurality of stages, where i is an integer greater than or equal to two, including: an output transistor including a control electrode connected to a first node, an input electrode configured to receive a clock signal, and an output electrode connected to an output terminal; a control transistor including a control electrode configured to receive an output of an i−1th stage, an input electrode connected to the control electrode, and an output electrode connected to the first node; a pull-down transistor including a control electrode configured to receive an output signal of an i+1th stage, an input electrode configured to receive a first low voltage, and an output electrode connected to the output terminal; a holding transistor including a control electrode connected to a second node, an input electrode configured to receive a second low voltage having a higher level than that of the first low voltage, and an output electrode connected to the output terminal; and a stabilization transistor including a control electrode configured to receive an output signal of an i+2th stage, an input electrode configured to receive the second low voltage, and an output electrode connected to the output terminal.

In an embodiment, the output terminal may be configured to output a gate signal including a gate on voltage and a gate off voltage, and the gate driving circuit may further include an inverter transistor configured to maintain the second node at the gate off voltage when the gate signal is the gate on voltage.

In an embodiment, the gate driving circuit may further include a capacitor connected between the first node and the output terminal.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept, and together with the description, serve to explain aspects and features of the inventive concept. In the drawings.

DETAILED DESCRIPTION

Figure 1:
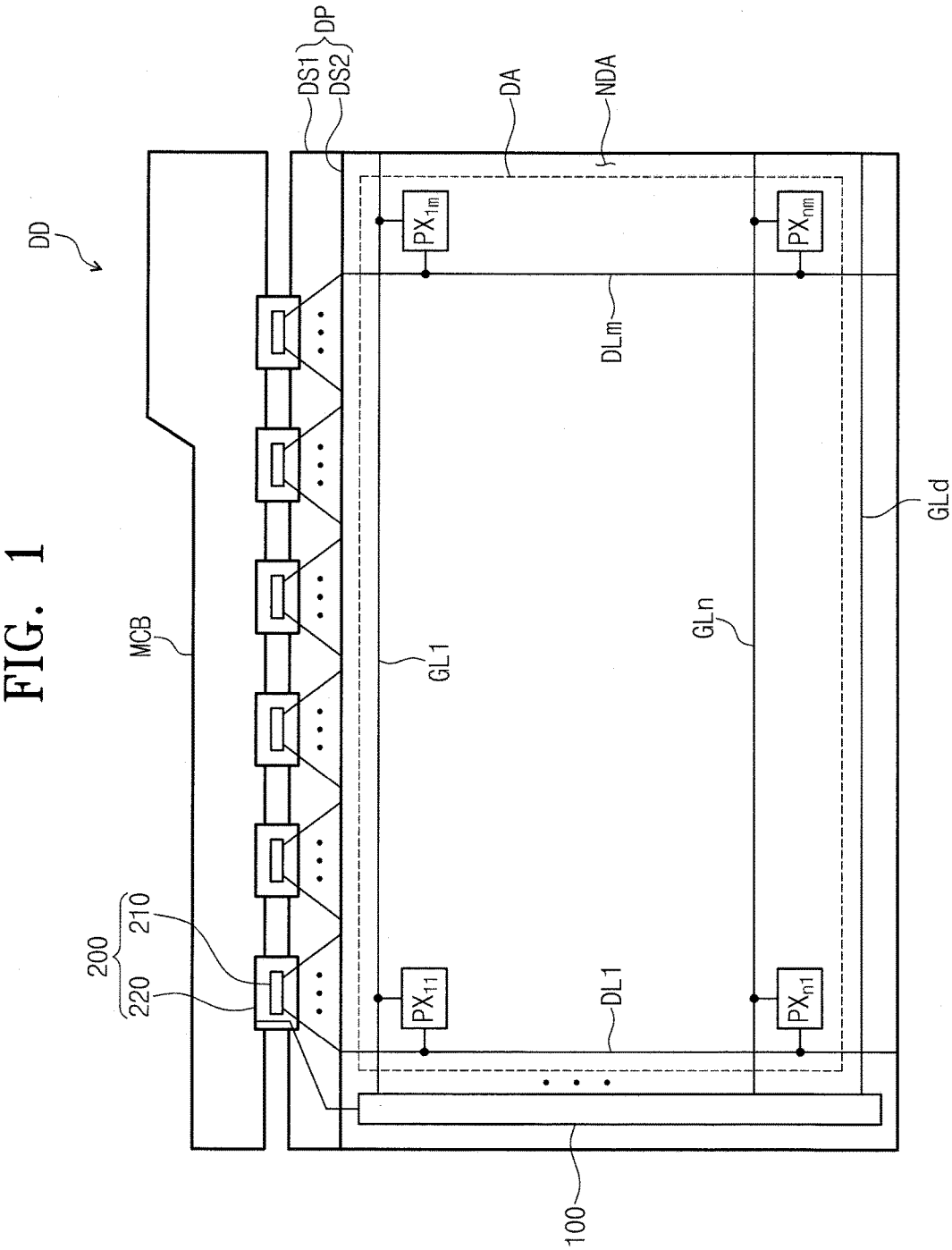
FIG. 1 is a block diagram illustrating a display device according to an embodiment of the inventive concept.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
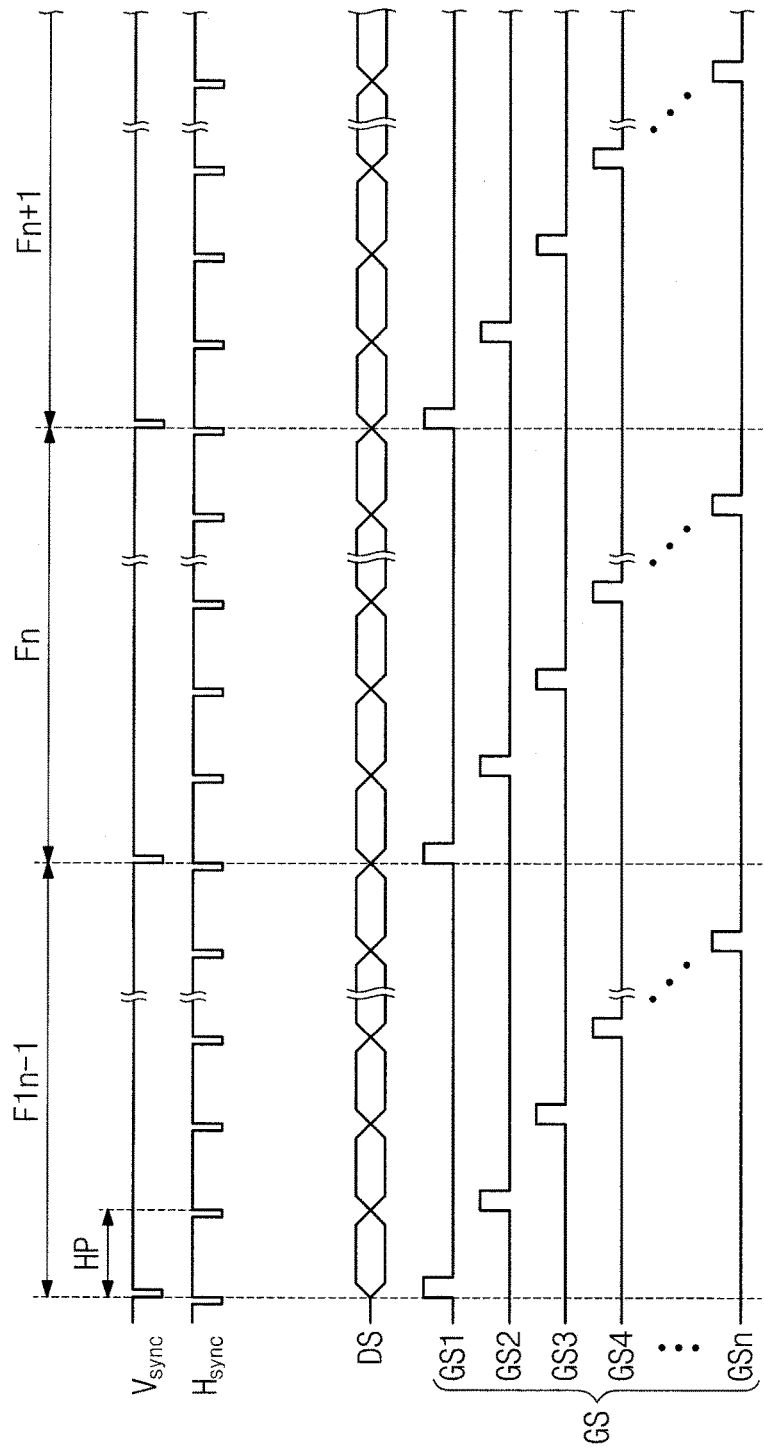
FIG. 2 is a timing diagram illustrating signals of a display device according to an embodiment of the inventive concept.

FIG. 1 is a plan view of a display device according to an embodiment of the inventive concept. FIG. 2 is a timing diagram illustrating signals of a display device according to an embodiment of the inventive concept.

As shown in FIGS. 1 and 2, a display device according to an embodiment of the inventive concept includes a display panel DP, a gate driving circuit (e.g., a gate driver) 100, and a data driving circuit (e.g., a data driver) 200.

The display panel DP is not limited to a specific embodiment of the inventive concept and may include various display panels, such as a liquid crystal display panel, an organic light emitting display panel, an electrophoretic display panel, and/or an electrowetting display panel. For convenience, the display panel DP is described as a liquid crystal display panel. When the display panel DP includes a liquid crystal display panel, the liquid crystal display device including the liquid crystal display panel may further include a polarizer and a backlight unit (e.g., a backlight source).

The display panel DP includes a first substrate DS1, a second substrate DS2 spaced from the first substrate DS1, and a liquid crystal layer LCL disposed between the first substrate DS1 and the second substrate DS2. On a plane, the display panel DP includes a display area DA including a plurality of pixels PX11 to PXnm, and a non-display area NDA surrounding the display area DA.

The display panel DP includes a plurality of gate lines GL1 to GLn disposed on the first substrate DS1, and a plurality of data lines DL1 to DLm crossing the plurality of gate lines GL1 to GLn. The plurality of gate lines GL1 to GLn are connected to the gate driving circuit 100. The plurality of data lines DL1 to DLm are connected to the data driving circuit 200. For convenience, some of the plurality of gate lines GL1 to GLn and some of the plurality of data lines DL1 to DLm are illustrated in FIG. 1. Additionally, the display panel DP may further include a dummy gate line GLd disposed in the non-display area NDA of the first substrate DS1.

For convenience, some of the plurality of pixels PX11 to PXnm are illustrated in FIG. 1. The plurality of pixels PX11 to PXnm are respectively connected to corresponding gate lines from among the plurality of gate lines GL1 to GLn and corresponding data lines from among the plurality of data lines DL1 to DLm. However, the dummy gate line GLd may not be connected to the plurality of pixels PX11 to PXnm.

The plurality of pixels PX11 to PXnm may be divided into a plurality of groups according to a color to be displayed. The plurality of pixels PX11 to PXnm may display any one of primary colors. The primary colors may include red, green, blue, and/or white. However, the inventive concept is not limited thereto, and thus, the primary colors may further include (or alternatively include) various colors, such as yellow, cyan, magenta, etc.

The gate driving circuit 100 and the data driving circuit 200 receive a control signal from a first signal control unit (e.g., a first controller, for example, a timing controller). The first control unit may be mounted on a main circuit board MCB. The first signal control unit receives image data and control signals from an external first graphic control unit (e.g., a first graphic controller). The control signals may include vertical sync signals Vsync that are signals for distinguishing frame sections Fn−1, Fn, and Fn+1, horizontal sync signals Hsync that are signals for distinguishing horizontal sections HP (e.g., row distinction signals), data enable signals (that may be, for example, in high level only during a section where data is outputted to display a data incoming area), and clock signals.

The gate driving circuit 100 generates gate signals GS1 to GSn on the basis of a control signal (hereinafter referred to as a gate control signal) received from the first signal control unit during frame sections Fn−1, Fn, and Fn+1, and outputs the gate signals GS1 to GSn to the plurality of gate lines GL1 to GLn. The gate signals GS1 to GSn may be sequentially outputted in correspondence to the horizontal sections HP. The gate driving circuit 100 and the pixels PX11 to PXnm may be formed concurrently (e.g., simultaneously) through a thin film process. For example, the gate driving circuit 100 may be mounted in an Amorphous Silicon TFT Gate driver circuit (ASG) form or an Oxide Semiconductor TFT Gate driver circuit (OSG) form at (e.g., in) the non-display area NDA.

FIG. 1 illustrates one gate driving circuit 100 connected to the left ends of the plurality of gate lines GL1 to GLn. However, the inventive concept is not limited thereto, for example, according to an embodiment of the inventive concept, a display device may include two gate driving circuits. One of the two gate driving circuits may be connected to the left ends of the plurality of gate lines GL1 to GLn and the other one of the two may be connected to the right ends of the plurality of gate lines GL1 to GLn. Further, one of the two gate driving circuits may be connected to odd gate lines and the other one of the two may be connected to even gate lines.

The data driving circuit 200 generates gray level voltages according to image data provided from the first signal control unit on the basis of a control signal (hereinafter referred to as a data control signal) received from the first signal control unit. The data driving circuit 200 outputs the gray level voltages as data voltages DS to the plurality of data lines DL1 to DLm.

The data voltages DS may include positive data voltages each having a positive value with respect to a common voltage, and/or negative data voltages each having a negative value with respect to the common voltage. Some of data voltages applied to the data lines DL1 to DLm may each have a positive polarity and others may each have a negative polarity during each of the horizontal sections HP. The polarity of the data voltages DS may be inverted according to the frame sections Fn−1, Fn, and Fn+1, in order to prevent or reduce the deterioration of liquid crystals. The data driving circuit 200 may generate data voltages inverted by each frame section unit in response to an invert signal.

The data driving circuit 200 may include a driving chip 210 and a flexible circuit board 220 on which the driving chip 210 is mounted. The data driving circuit 200 may include a plurality of driving chips 210 and a plurality of flexible circuit boards 220. The flexible circuit board 220 connects (e.g., electrically connects) the main circuit board MCB and the first substrate DS1. The plurality of driving chips 210 provide data signals to corresponding data lines from among the plurality of data lines DL1 to DLm.

FIG. 1 illustrates a Tape Carrier Package (TCP) type (form) data driving circuit 200 as an example. However, the inventive concept is not limited thereto, for example, according to an embodiment of the inventive concept, the data driving circuit 200 may be disposed at (e.g., in) the non-display area NDA of the first substrate DS1 through a Chip on Glass (COG) method.

Figure 3:
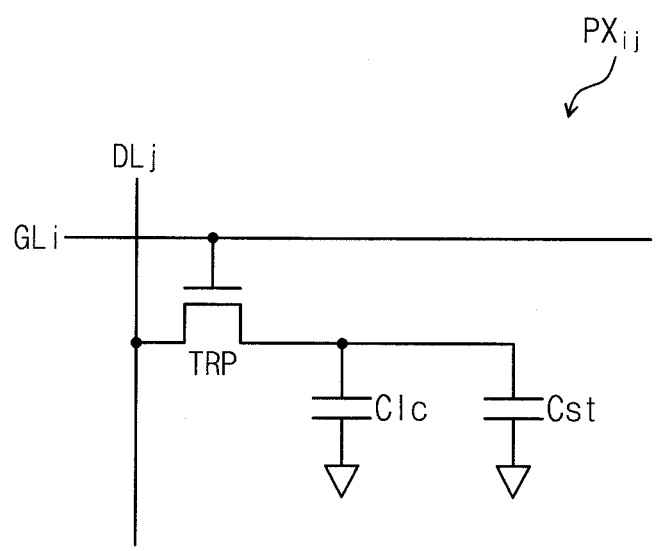
FIG. 3 is an equivalent circuit diagram of a pixel according to an embodiment of the inventive concept.
Figure 4:
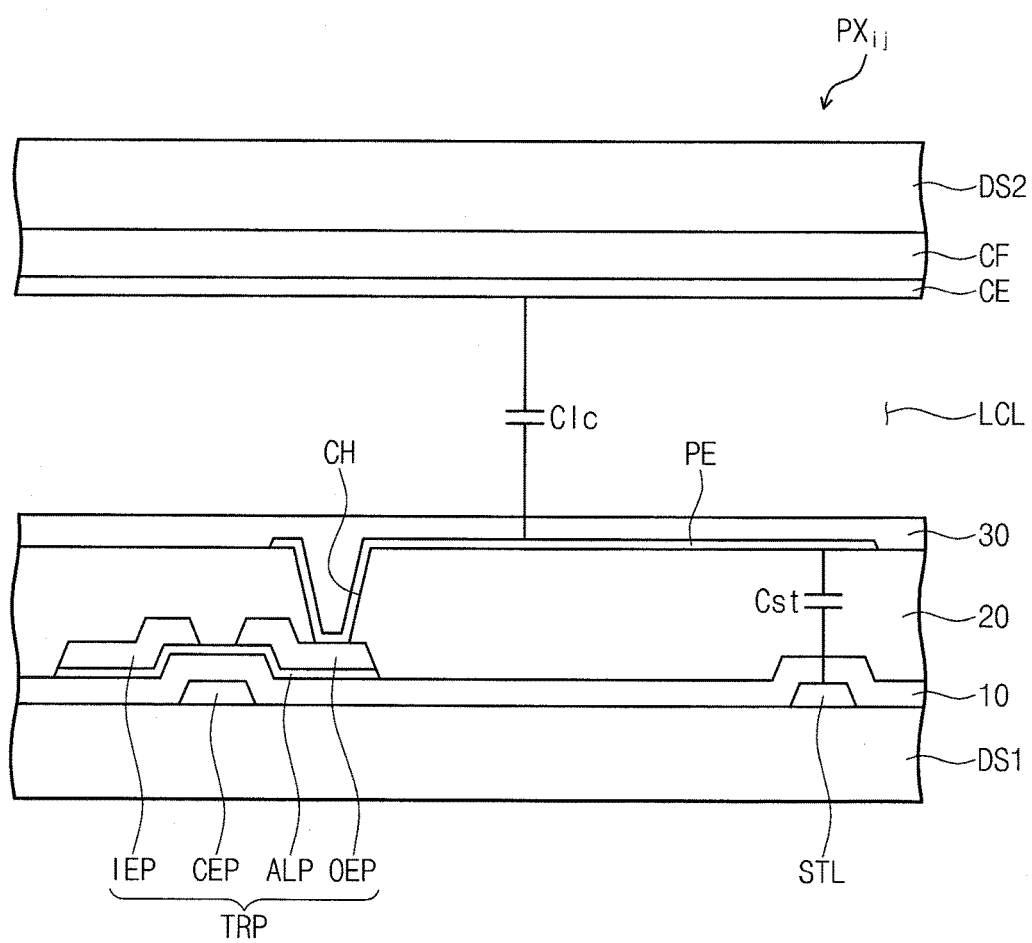
FIG. 4 is a sectional view of a pixel according to an embodiment of the inventive concept.

FIG. 3 is an equivalent circuit diagram of a pixel PXij according to an embodiment of the inventive concept. FIG. 4 is a sectional view of a pixel PXij according to an embodiment of the inventive concept. Each of the plurality of pixels PX11 to PXnm shown in FIG. 1 may have the same or substantially the same circuit as that shown in FIG. 3.

As shown in FIG. 3, the pixel PXij includes a pixel thin film transistor (hereinafter referred to as a pixel transistor) TRP, a liquid crystal capacitor Clc, and a storage capacitor Cst. According to an embodiment of the inventive concept, the storage capacitor Cst may be omitted.

The pixel transistor TRP is electrically connected to an ith gate line GLi and a jth data line DLj. The pixel transistor TRP outputs a pixel voltage corresponding to a data signal received from the jth data line DLj in response to a gate signal received from the ith gate line GLi.

The liquid crystal capacitor Clc charges a pixel voltage outputted from the pixel transistor TRP. An arrangement of liquid crystal directors included in the liquid crystal layer LCL (see FIG. 4) is changed according to a charge amount charged in the liquid crystal capacitor Clc. The light incident to the liquid crystal layer LCL may be transmitted or blocked according to an arrangement of the liquid crystal directors.

The storage capacitor Cst is connected in parallel to the liquid crystal capacitor Clc. The storage capacitor Cst maintains or substantially maintains an arrangement of the liquid crystal directors during a set or predetermined section.

As shown in FIG. 4, the pixel transistor TRP includes a control electrode CEP (hereinafter referred to as a pixel control electrode) connected to the ith gate line GLi (see FIG. 3), an activation layer ALP (hereinafter referred to as a pixel activation layer) overlapping with the pixel control electrode CEP, an input electrode IEP (hereinafter referred to as a pixel input electrode) connected to the jth data line DLj (see FIG. 3), and an output electrode OEP spaced from the pixel input electrode IEP.

The liquid crystal capacitor Clc includes a pixel electrode PE and a common electrode CE. The storage capacitor Cst includes the pixel electrode PE and a portion of a storage line STL overlapping with the pixel electrode PE.

The ith gate line GLi and the storage line STL are disposed on a surface (e.g., one surface) of the first substrate DS1. The pixel control electrode CEP is branched from the ith gate line GLi. The ith gate line GLi and the storage line STL may include a metal (for example, Al, Ag, Cu, Mo, Cr, Ta, Ti, etc.) or an alloy thereof. The ith gate line GLi and the storage line STL may have a multi-layer structure, and for example, may include a Ti layer and a Cu layer.

A first insulating layer 10 covering the pixel control electrode CEP and the storage line STL is disposed on a surface (e.g., one surface) of the first substrate DS1. The first insulating layer 10 may include at least one of an inorganic material and an organic material. The first insulating layer 10 may be an organic layer or an inorganic layer. The first insulating layer 10 may have a multi-layer structure, and for example, may include a silicon nitride layer and a silicon oxide layer.

The activation layer ALP overlapping the pixel control electrode CEP is disposed on the first insulating layer 10. The pixel activation layer ALP may include a semiconductor layer and an ohmic contact layer.

The pixel activation layer ALP may include amorphous silicon or poly silicon. Additionally, the pixel activation layer ALP may include a metal oxide semiconductor.

The pixel output electrode OEP and the pixel input electrode IEP are disposed on the pixel activation layer ALP. The pixel output electrode OEP and the pixel input electrode IEP are spaced from each other. Each of the pixel output electrode OEP and the pixel input electrode IEP may partially overlap with the pixel control electrode CEP.

Although the pixel transistor TRP having a staggered structure is shown in FIG. 4 exemplarily, a structure of the pixel transistor TRP is not limited thereto. For example, in an embodiment, the pixel transistor TRP may have a planar structure.

A second insulating layer 20 covering the pixel activation part ALP, the pixel output electrode OEP, and the pixel input electrode IEP is disposed on the first insulating layer 10. The second insulating layer 20 may provide a flat surface. The second insulating layer 20 may include an organic material.

The pixel electrode PE is disposed on the second insulating layer 20. The pixel electrode PE is connected to the pixel output electrode OEP through the second insulating layer 20 and a contact hole CH penetrating the second insulating layer 20. An alignment layer 30 covering the pixel electrode PE may be disposed on the second insulating layer 20.

A color filter layer CF is disposed on a surface (e.g., one surface) of the second substrate DS2. The common electrode CE is disposed on the color filter layer CF. A common voltage is applied to the common electrode CE. A common voltage and a pixel voltage may have different values. In an embodiment, an alignment layer covering the common electrode CE may be disposed on the common electrode CE. In an embodiment, another insulating layer may be disposed between the color filter layer CF and the common electrode CE.

The pixel electrode PE and the common electrode CE with the liquid crystal layer LCL therebetween form the liquid crystal capacitor Clc. Additionally, portions of the pixel electrode PE and the storage line STL, which are disposed with the first insulating layer 10 and the second insulating layer 20 therebetween, form the storage capacitor Cst. The storage line STL receives a storage voltage having a different value from that of a pixel voltage. A storage voltage may have the same or substantially the same value as that of the common voltage.

On the other hand, a section of the pixel PXij shown in FIG. 4 is just one example. For example, in an embodiment, unlike those of FIG. 4, at least one of the color filter layer CF and the common electrode CE may be disposed on the first substrate DS1. That is, a liquid crystal display panel according to an embodiment of the inventive concept may include a pixel in a Vertical Alignment (VA) mode, a Patterned Vertical Alignment (PVA) mode, an in-plane switching (IPS) mode, a fringe-field switching (FFS) mode, or a Plane to Line Switching (PLS) mode.

Figure 5:
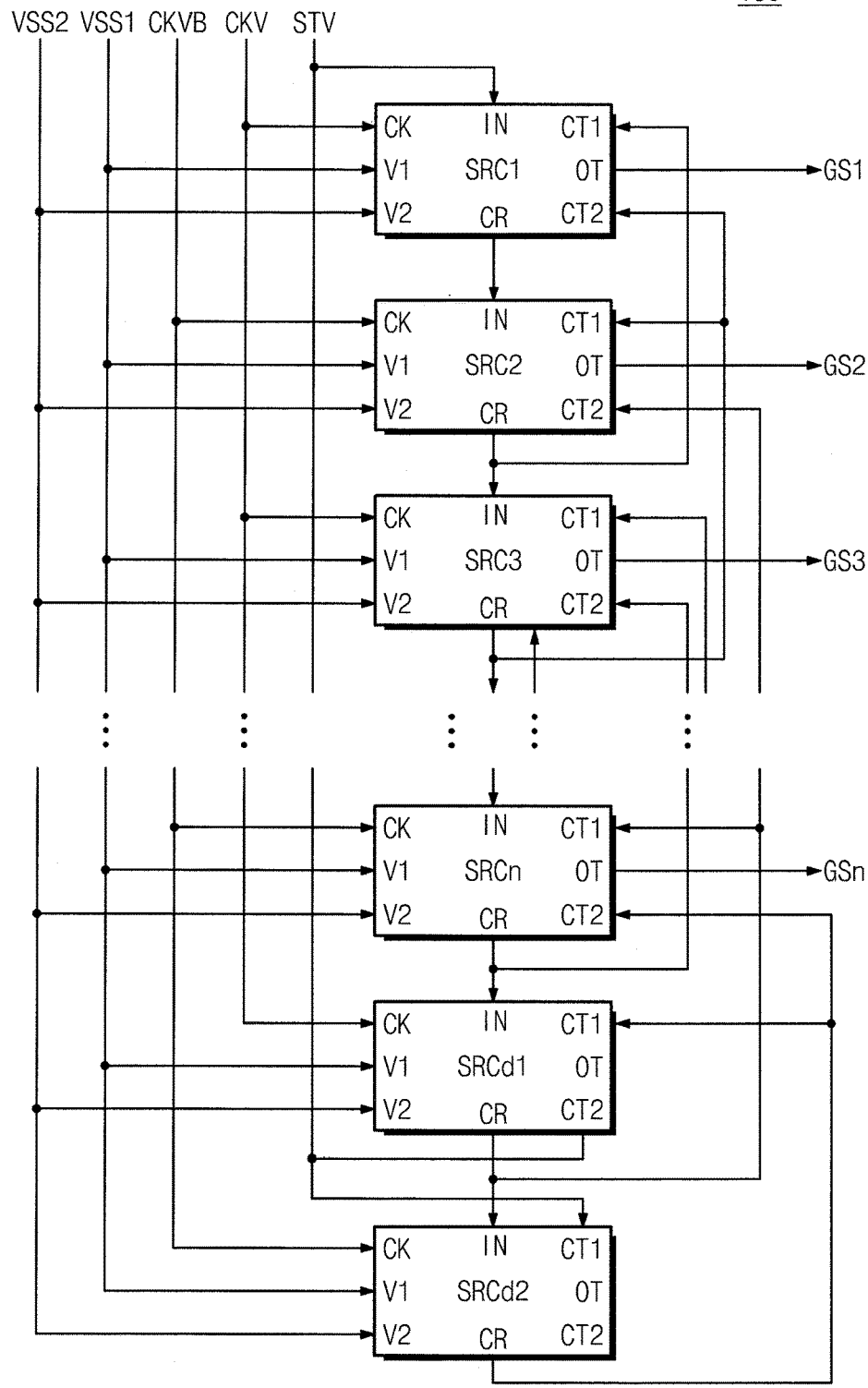
FIG. 5 is a block diagram illustrating a gate driving circuit according to an embodiment of the inventive concept.

FIG. 5 is a block diagram illustrating a gate driving circuit according to an embodiment of the inventive concept. As shown in FIG. 5, a gate driving circuit 100 includes a plurality of stages SRC1 to SRCn. The plurality of stages SRC1 to SRCn may configure one shift register. As shown in FIG. 5, the plurality of stages SRC1 to SRCn may be connected in cascade to each other.

The plurality of stages SRC1 to SRCn are respectively connected to the plurality of gate lines GL1 to GLn. That is, the plurality of stages SRC1 to SRCn provide gate signals GS1 to GSn to the plurality of gate lines GL1 to GLn, respectively.

Each of the plurality of stages SRC1 to SRCn includes an input terminal IN, a clock terminal CK, first and second voltage input terminals V1 and V2, first and second control terminals CT1 and CT2, an output terminal OT, and a carry terminal CR.

The carry terminal CR of each of the plurality of stages SRC1 to SRCn is electrically connected to the input terminal IN of a next driving stage. The input terminal IN of a first stage SRC1 receives a start signal STV for starting the drive of the gate driving circuit 100, instead of a carry signal of a previous stage. After the first stage, the input terminal IN of each of the plurality of stages SRC2 to SRCn receives a carry signal of a previous stage. The input terminal IN of the ith stage is electrically connected to the carry terminal CR of the i−1th stage. Here, i is an integer greater than 1 and less than n. As shown in FIG. 5, the input terminals IN of the second stage SRC2 and the third stage SRC3 respectively receive the carry signals of the first stage SRC1 and the second stage SRC2.

Moreover, this is just one example, and the input terminal IN of the ith stage may be electrically connected to the carry terminal of any of a previous stage, for example, the carry terminal of the i−1th stage, the i−2th stage, or the i−3th stage. For example, the second stage SRC2 may receive a start signal that is different from the start signal received by the first stage SRC1, and the input terminal IN of the third stage SRC3 may receive the carry signal of the first stage SRC1.

The first control terminal CT1 of each of the plurality of stages SRC1 to SRCn is electrically connected to the carry terminal CR of the next stage, to receive a carry signal of the next stage. The second control terminal CT2 of each of the plurality of stages SRC1 to SRCn is electrically connected to the carry terminal CR of a stage connected in cascade to the next stage (e.g., a second next stage).

For example, the first control terminal CT1 of the ith stage is electrically connected to the carry terminal CR of the i+1th stage, and the second control terminal CT2 of the ith stage is electrically connected to the carry terminal CR of the i+2th stage. As shown in FIG. 5, the first control terminal CT1 of the first stage SRC1 is electrically connected to the carry terminal CR of the second stage SRC2, and the second control terminal CT2 of the first stage SRC1 is electrically connected to the carry terminal CR of the third stage SRC3.

However, the first and second control terminals CT1 and CT2 of the last driving stage SRCn from among the plurality of stages SRC1 to SRCn receive signals corresponding to carry signals from dummy stages SRCd1 and SRCd2. The dummy stages SRCd1 and SRCd2 are sequentially connected to the end (e.g., the rear end) of the last driving stage SRCn. However, the position and number of the dummy stages SRCd1 and SRCd2 may be variously changed according to the design of the gate driving circuit 100 as would be known to one skilled in the art.

Moreover, this is just one example, and the first control terminal CT1 of the ith stage may be electrically connected to any of the carry terminals CR of a stage following the ith stage. Additionally, the second control terminal CT2 of the ith stage may be electrically connected to any of the carry terminals CR of a stage following a stage that provides a carry signal to the first control terminal CT1.

FIG. 5 is just an example of a gate driving circuit, and a connection relationship of the plurality of stages SRC1 to SRCn shown in FIG. 5 may be variously changed.

For example, unlike in FIG. 5, the input terminals IN of the plurality of stages SRC1 to SRCn may respectively receive gate signals from the output terminals OT of previous stages. That is, carry signals or gate signals applied to the input terminals IN of the plurality of stages SRC1 to SRCn are one control signal for controlling an operation of the plurality of stages SRC1 to SRCn.

Additionally, in some embodiments, the first control terminal CT1 of each of the plurality of stages SRC1 to SRCn may be electrically connected to the output terminal OT of the next stage, instead of the carry terminal CR of the next stage, to receive a gate signal from the next stage. In some embodiments, the second control terminal CT2 of each of the plurality of stages SRC1 to SRCn may be electrically connected to the output terminal OT of a stage connected in cascade to the next stage (e.g., the second next stage). The second control terminal CT2 of each of the plurality of stages SRC1 to SRCn may receive a gate signal from a stage connected in cascade to the next stage (e.g., the second next stage).

The odd stages SRC1, SRC3, etc. and the even stages SRC2, SRC4, etc. from among the plurality of stages SRC1 to SRCn receive phase-inverted signals, respectively. The clock terminals CK of the odd stages SRC1, SRC3, etc. receive clock signals CKV, and the clock terminals CK of the even stages SRC2, SRC4, etc. receive clock bar signals CKVB.

The clock signal CKV and the clock bar signal CKVB have a phase difference of, for example, about 180°. Each of the clock signal CKV and the clock bar signal CKVB may swing between a first clock voltage VCK1 and a second clock voltage VCK2. The first clock voltage VCK1 may be, for example, about 15V to about 35V. The second clock voltage VCK2 may be, for example, about −16V to about −10V.

A first low voltage VSS1 is applied to the first voltage input terminal V1 of each of the plurality of stages SRC1 to SRCn, and a second low voltage VSS2 having a higher voltage level than that of the first low voltage VSS1 is applied to the second voltage input terminal V2 of each of the plurality of stages SRC1 to SRCn. The second low voltage VSS2 may be, for example, about −10 V to about −5 V, and the first low voltage VSS1 may be, for example, about −16 V to about −10 V. As one example, the first low voltage VSS1 may be about −11.5 V, and the second low voltage VSS2 may be about −7.5 V. The first low voltage VSS1 may have the same or substantially the same level as that of the second clock voltage VCK2.

The output terminal OT of each of the plurality of stages SRC1 to SRCn is connected to a corresponding gate line. Accordingly, a gate signal outputted through the output terminal OT is applied to a corresponding gate line.

Figure 6:
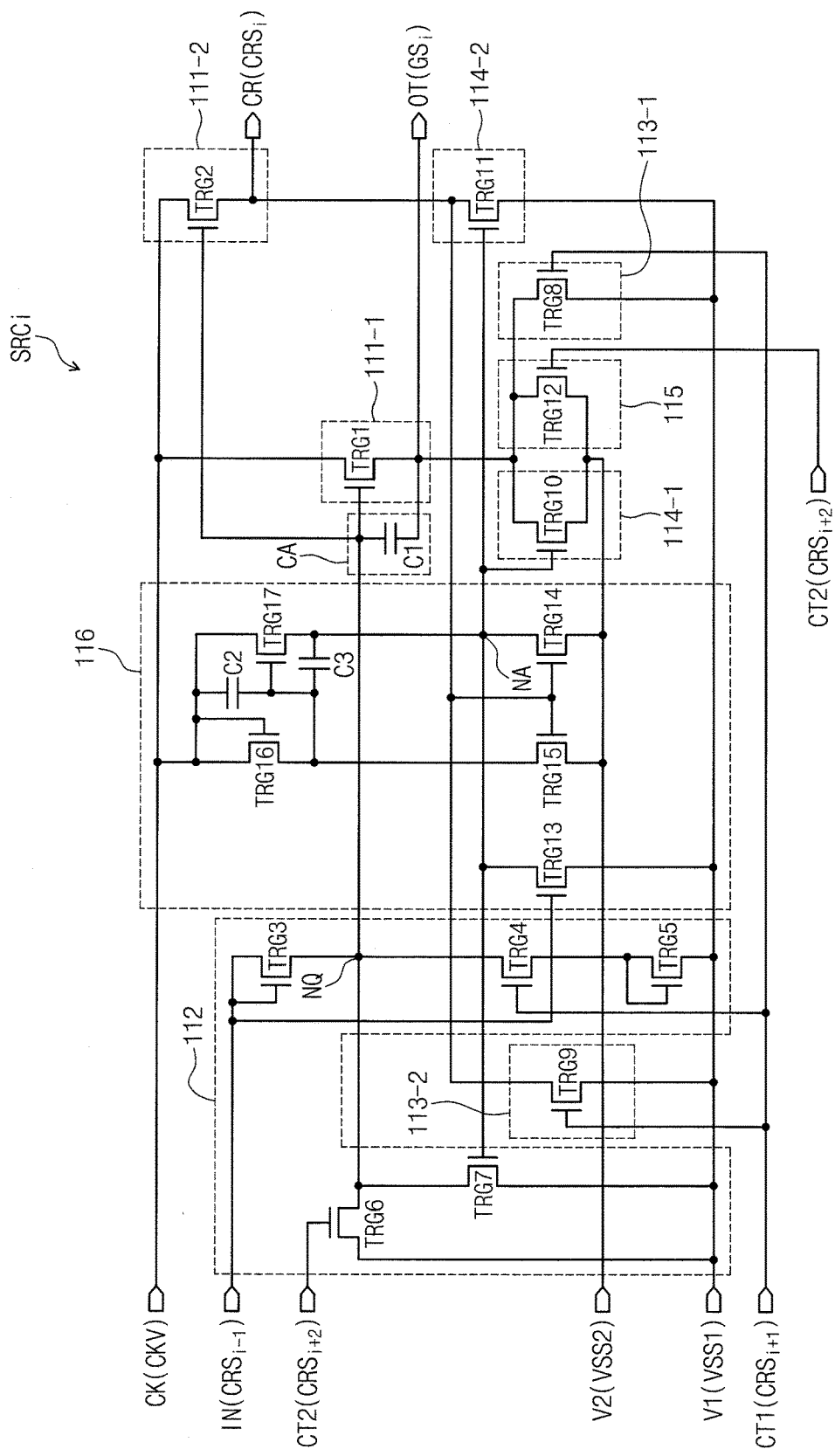
FIG. 6 is a circuit diagram illustrating an ith stage among a plurality of stages shown in FIG. 5.
Figure 7:
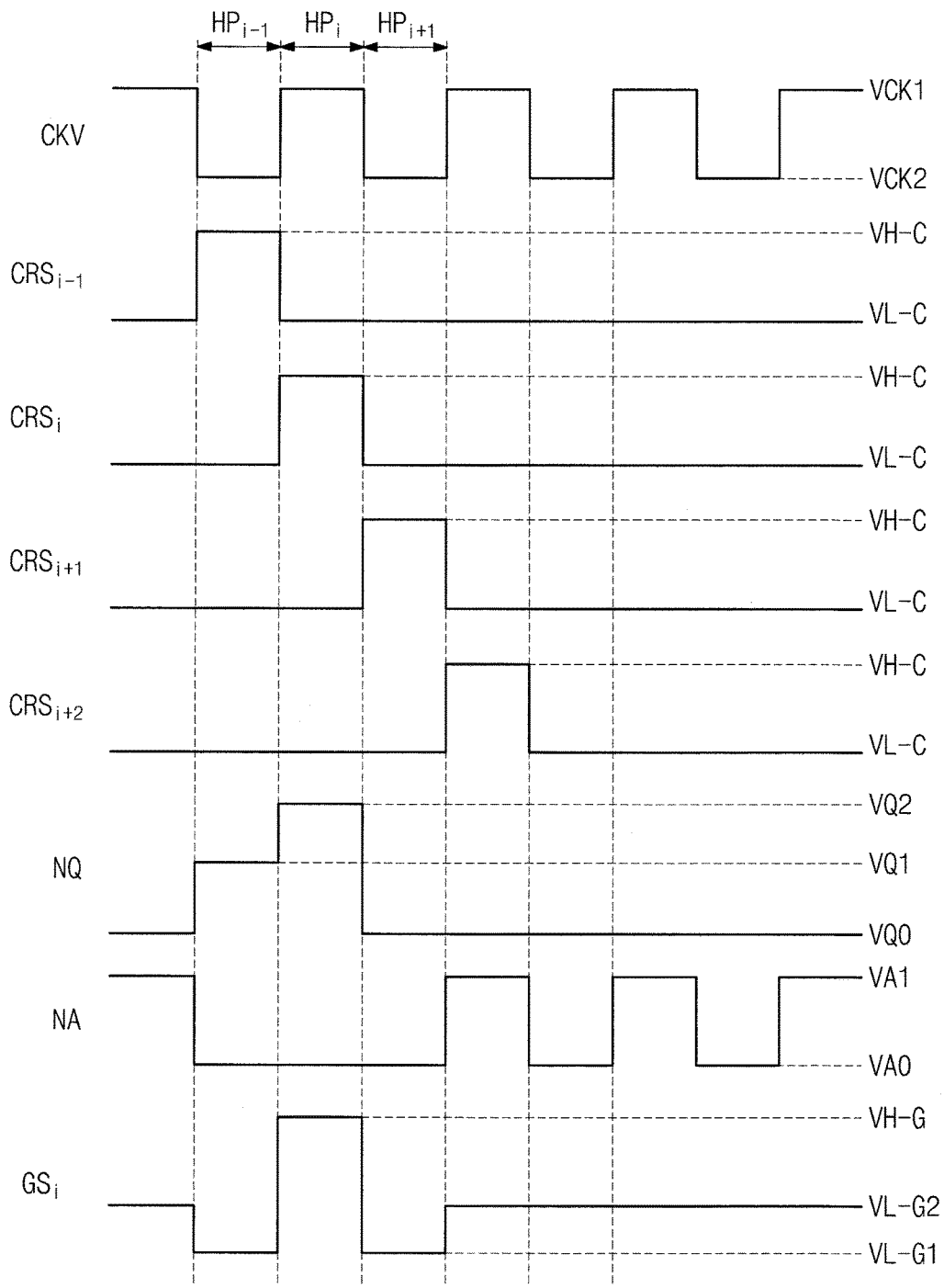
FIG. 7 is an input/output signal waveform diagram illustrating an ith stage shown in FIG. 6.

FIG. 6 is a circuit diagram illustrating the ith stage SRCi from among the plurality of stages SRC1 to SRCn shown in FIG. 5, and FIG. 7 is an input/output signal waveform diagram of the ith stage SRCi shown in FIG. 6. Each of the plurality of stages SRC1 to SRCn shown in FIG. 5 may have the same or substantially the same circuit configuration as that of FIG. 6.

The ith stage SRCi includes a first output unit 111-1, a second output unit 111-2, a charging unit CA, a first control unit 112, a first pull-down unit 113-1, a second pull-down unit 113-2, a first holding unit 114-1, a second holding unit 114-2, a stabilization unit 115, and a second control unit 116.

The first output unit 111-1 outputs a gate signal GSi to the ith gate line, and the second output unit 111-2 outputs a carry signal CRSi to the i+1th stage.

The charging unit CA is charged by a high voltage of the carry signal CRSi−1 of the i−1th stage applied to a first node NQ.

The first control unit 112 controls on/off operations of the first output unit 111-1 and the second output unit 111-2, by adjusting a voltage of the first node NQ. The first control unit 112 turns on the first output unit 111-1 and the second output unit 111-2 in response to the carry signal CRSi−1 of the i−1th stage, and turns off the first output unit 111-1 and the second output unit 111-2 in response to the carry signal CRSi+1 of the i+1th stage. Then, the first control unit 112 maintains or substantially maintains the first node NQ with the first low voltage VSS1 in response to the carry signal CRSi+2 of the i+2th stage and a level (e.g., a potential level) of a second node NA.

The first pull-down unit 113-1 lowers the potential of the output terminal OT to the first low voltage VSS1, and the second pull-down unit 113-2 lowers the potential of the carry terminal CR to the first low voltage VSS1.

After the voltage of the output terminal OT is lowered to the first low voltage VSS1, the first holding unit 114-1 provides the second low voltage VSS2 to the output terminal OT. After the potential of the carry terminal CR is lowered to the first low voltage VSS1, the second holding unit 114-2 provides the first low voltage VSS1 to the carry terminal CR.

The stabilization unit 115 provides the second low voltage VSS2 to the output terminal OT in response to the carry signal CRSi+2 of the i+2th stage.

The second control unit 116 controls operations of the first holding unit 114-1 and the second holding unit 114-2. The second control unit 116 provides an inverter signal to the second node NA for turning on/off the first holding unit 114-1 and the second holding unit 114-2. Herein, the second node NA is a node (e.g., a portion) where an inverter signal generated based on a clock signal from the second control unit 116 is applied, and is connected to the control electrode of each of the first holding unit 114-1 and the second holding unit 114-2. Additionally, the second node NA is connected to a control terminal of a fifth control transistor TRG7 of the first control unit 112, and is involved in applying the first low voltage VSS1 to the first node NQ.

Each of carry signals CRSi−1, CRSi, CRSi+1, and CRSi+2 includes a section for maintaining or substantially maintaining a carry-high voltage VH-C and a section for maintaining or substantially maintaining a carry-low voltage VL-C. The carry-high voltage VH-C is identical or substantially identical to the first clock voltage VCK1. The carry-low voltage VL-C is identical or substantially identical to the first low voltage VSS1.

The gate signal GSi includes a section for maintaining or substantially maintaining a gate-high voltage VH-G, a section for maintaining or substantially maintaining a first gate-low voltage VL-G1, and a section for maintaining or substantially maintaining a gate-low voltage VL-G2. The gate-high voltage VH-G is identical or substantially identical to the first clock voltage VCK1. The first gate-low voltage VL-G1 is identical or substantially identical to the first low voltage VSS1. The second gate-low voltage VL-G2 is identical or substantially identical to the second low voltage VSS2.

Referring to FIGS. 6 and 7, a configuration of the ith stage SRCi will be described in more detail. FIG. 7 is a view illustrating a horizontal section HPi (hereinafter referred to as an ith horizontal section) where an ith gate signal GSi is outputted, an immediately previous horizontal section HPi−1 (hereinafter referred to as an i−1th horizontal section), and an immediately after horizontal section HPi+1 (hereinafter referred to as an i+1th horizontal section), from among a plurality of horizontal sections.

The first output unit 111-1 includes a first output transistor TRG1. The first output transistor TRG1 includes an input electrode for receiving a clock signal CKV, a control electrode connected to the first node NQ, and an output electrode connected to the output terminal OT. The gate signal GSi is outputted through the output terminal OT. The first node NQ is an output terminal of the first control unit 112.

The second output unit 111-2 includes a second output transistor TRG2. The second output transistor TRG2 includes an input electrode for receiving a clock signal CKV, a control electrode connected to the first node NQ, and an output electrode connected to the carry terminal CR. A carry signal CRSi is outputted through the carry terminal CR.

The charging unit CA includes a first capacitor C1. The first capacitor C1 is disposed between the control electrode and the output electrode of the first output transistor TRG1. One end of the first capacitor C1 is connected to the first node NQ and the other end of the first capacitor C1 is connected to the output terminal OT.

The first control unit 112 includes first to fifth control transistors TRG3, TRG4, TRG5, TRG6, and TRG7.

The first control transistor TRG3 includes a control electrode and an input electrode, which commonly receive the carry signal CRSi−1 of the i−1th stage. The carry signal CRSi−1 of the i−1th stage is a control signal applied to the control electrode of the first control transistor TRG3. Additionally, the output electrode of the first control transistor TRG3 is connected to the control electrode of each of the first output transistor TRG1 and the second output transistor TRG2 through the first node NQ.

The second control transistor TRG4 includes an output electrode connected to the first node NQ, a control electrode for receiving the carry signal CRSi+1 of the i+1th stage, and an input electrode connected to the output electrode of the third control transistor TRG5.

In relation to the third control transistor TRG5, the output electrode is connected to the control electrode in order to perform a diode function. Additionally, the third control transistor TRG5 includes an input electrode connected to the first voltage input terminal V1 where the first low voltage VSS1 is applied. However, the inventive concept is not limited thereto, and in an embodiment, the third control transistor TRG5 may be omitted. When the third control transistor TRG5 is omitted, the input electrode of the second control transistor TRG4 is connected to the first voltage input terminal V1 to receive (e.g., directly receive) the first low voltage VSS1.

When the first control transistor TRG3 is turned on in response to the carry signal CRSi−1 of the i−1th stage, the potential of the first node NQ is raised to a first high voltage VQ1, and the first output transistor TRG1 and the second output transistor TRG2 are turned on. At this point, as the first output transistor TRG1 of the first output unit 111-1 is turned on, the first low voltage VSS1 of the clock signal CKV from the clock terminal CK is applied to the output terminal OT, so that the level of the first gate signal GS1 becomes the first low voltage VSS1.

When the carry signal CRSi−1 of the i−1th stage is applied to the first node NQ, the first capacitor C1 is charged. Then, the first output transistor TRG1 is bootstrapped. That is, the first node NQ connected to the control electrode of the first output transistor TRG1 is boosted from the first high voltage VQ1 to a second high voltage VQ2.

When the second control transistor TRG4 and the third control transistor TRG5 are turned on in response to the carry signal CRSi+1 of the i+1th stage, the potential of the first node NQ is reduced. When the potential of the first node NQ is reduced, the first and second transistors TRG1 and TRG2 connected to the first node NQ are turned off.

The fourth control transistor TRG6 includes an input electrode connected to the first voltage input terminal V1 to receive the first low voltage VSS1, a control electrode connected to a second control terminal CR2 to receive the carry signal CRSi+2 of the i+2th stage, and an output electrode connected to the first node NQ.

The fourth control transistor TRG6 supplies the first low voltage VSS1 to the first node NQ in response to the carry signal CRSi+2 of the i+2th stage. Accordingly, the potential of the first node NQ is maintained or substantially maintained at the first low voltage VSS1 by the carry signal CRSi+2 of the i+2th stage.

The fifth control transistor TRG7 includes an input electrode connected to the first voltage input terminal V1, a control electrode connected to the second node NA, and an output electrode connected to the first node NQ.

The fifth control transistor TRG7 is turned on or off according to the potential of the second node NA. When the potential of the second node NA is low, the fifth control transistor TRG7 is turned off. When the potential of the second node NA rises by the clock signal CKV, the fifth control transistor TRG7 is turned on.

The turned-on fifth control transistor TRG7 drops the potential of the first node NQ to the first low voltage VSS1. Thereby, the potential of the first node NQ is maintained or substantially maintained at the first low voltage VSS1 by the fourth and fifth control transistors TRG6 and TRG7 during a low section of the gate signal GSi.

The first pull-down unit 113-1 includes a first pull-down transistor TRG8. The first pull-down transistor TRG8 includes an output electrode connected to the output electrode of the first output transistor TRG1, a control electrode for receiving the carry signal CRSi+1 of the i+1th stage, and an input electrode connected to the first voltage input terminal V1 to receive the first low voltage VSS1.

The first pull-down transistor TRG8 drops a voltage of the output terminal OT to the first low voltage VSS1 in response to the carry signal CRSi+1 of the i+1th stage. Because the first low voltage VSS1 has a lower potential level than that of the second low voltage VSS2, a speed at which the first pull-down transistor TRG8 drops a voltage of the output terminal OT to the first low voltage VSS1 is faster than a speed at which the first pull-down transistor TRG8 drops a voltage of the output terminal OT to the second low voltage VSS2.

The first holding unit 114-1 includes a first holding transistor TRG10. After the voltage of the output terminal OT is at (e.g., lowered to) the first low voltage VSS1, the first holding transistor TRG10 provides the second low voltage VSS2 to the output terminal OT.

The first holding transistor TRG10 includes an output electrode connected to the output electrode of the first output transistor TRG1, a control electrode connected to the second node NA, and an input electrode connected to the second voltage input terminal V2 to receive the second low voltage VSS2.

That is, when the first node NQ is boosted to the second high voltage VQ2 in the ith horizontal section HPi, a level of the output terminal OT becomes a gate-high voltage VH-G. Then, as the first pull-down transistor TRG8 of the first pull-down unit 113-1 is turned on by the carry signal CRSi+1 of the i+1th stage, the first pull-down transistor TRG8 drops a level of the output terminal OT to a first gate-low voltage VL-G1 (or a first low voltage) drastically. When a level of the second node NA becomes a high voltage VA1 for the first time, the second node NA turns on the first holding transistor TRG10 to apply the second low voltage VSS2 to the output terminal OT.

The second pull-down unit 113-2 includes a second pull-down transistor TRG9. The second pull-down transistor TRG9 drops a voltage of the carry terminal CR to the first low voltage VSS1 in response to the carry signal CRSi+1 of the i+1th stage. The second pull-down transistor TRG9 includes a control electrode for receiving the carry signal CRSi+1 of the i+1th stage, an input electrode connected to the first voltage input terminal V1 to receive the first low voltage VSS1, and an output electrode connected to the carry terminal CR. The output electrode of the second pull-down transistor TRG9 is connected to the control electrodes of a second inverter transistor TRG14 and a third inverter transistor TRG15 that will be described in more detail later. Additionally, the output electrode of the second pull-down transistor TRG9 is connected to the output electrode of the second output transistor TRG2. However, the inventive concept is not limited thereto, and in an embodiment, the second pull-down transistor TRG9 may be omitted.

The second holding unit 114-2 includes a second holding transistor TRG11. After the voltage of the carry terminal CR is at (e.g., lowered to) the first low voltage VSS1, the second holding transistor TRG11 provides (e.g., continuously provides) the first low voltage VSS1 to the carry terminal CR.

The second holding transistor TRG11 includes an output electrode connected to the output electrode of the second output transistor TRG2, a control electrode connected to the second node NA, and an input electrode connected to the first voltage input terminal V1 to receive the first low voltage VSS1.

The stabilization unit 115 includes a stabilization transistor TRG12. The stabilization unit 115 provides the second low voltage VSS2 to the output terminal OT in response to the carry signal CRSi-2 of the i+2th stage.

The stabilization transistor TRG12 includes a control electrode for receiving the carry signal CRSi+2 of the i+2th stage, an input electrode for receiving the second low voltage VSS2, and an output electrode connected to the output terminal OT. The stabilization unit 115 helps the first holding unit 114-1 to stably maintain the voltage of the output terminal OT at the second low voltage VSS2. When the stabilization transistor TRG12 performs a part of a role for the first holding transistor TRG10, a size (or a width) of the first holding transistor TRG10 may be reduced. For example, the size of the ith stage SRCi according to an embodiment of the present disclosure may be reduced by about 18% compared to the size of a comparable ith stage.

The second control unit 116 includes first to fifth inverter transistors TRG13, TRG14, TRG15, TRG16, and TRG17, a second capacitor C2, and a third capacitor C3.

The second control unit 116 supplies the first low voltage VSS1 to the second node NA in response to the carry signal CRSi-1 of the i-1th stage. The first holding unit 114-1 and the second holding unit 114-2, which receive the first low voltage VSS1, are turned off. Then, the second control unit 116 provides the second low voltage VSS2 to the second node NA in response to the clock signal CKV. The turn-off of the first holding unit 114-1 and the second holding unit 114-2, which receive the second low voltage VSS2, are maintained or substantially maintained.

The second control unit 116 supplies a voltage corresponding to the clock signal CKV to the second node NA from the i+1th horizontal section Hpi+1 of the first output unit 111-1. That is, from the i+1th horizontal section Hpi+1, a low voltage VA0 and a high voltage VA1 are alternately applied to the second node NA.

The first inverter transistor TRG13 includes an output electrode connected to the second node NA, a control electrode for receiving the carry signal CRSi-1 of the i-1th stage, and an input electrode connected to the first voltage input terminal V1 to receive the first low voltage VSS1.

The second inverter transistor TRG14 includes an output electrode connected to the control electrode of the first holding transistor TRG10, a control electrode for receiving the carry signal CRSi from the second output unit 111-2, and an input electrode connected to the second voltage input terminal V2 to receive the second low voltage VSS2. Additionally, the control electrode of the second inverter transistor TRG14 is connected to the output electrode of the second pull-down transistor TRG9.

The third inverter transistor TRG15 includes a control electrode for receiving the carry signal CRSi from the second output unit 111-2, an input electrode connected to the second voltage input terminal V2 to receive the second low voltage VSS2, and an output electrode connected to an output electrode of the fourth inverter transistor TRG16.

The fourth inverter transistor TRG16 includes a control electrode and an input electrode, where the clock signal CKV is commonly applied. The output electrode of the fourth inverter transistor TRG16 is connected to the output electrode of the third inverter transistor TRG15.

The fifth inverter transistor TRG17 includes an input electrode for receiving a clock signal CKV, a control electrode connected to the output electrode of the fourth inverter transistor TRG16, and an output electrode connected to the second node NA.

The second capacitor C2 is connected between the input electrode and the control electrode of the fifth inverter transistor TRG17, and the third capacitor C3 is connected between the output electrode of the fourth inverter transistor TRG16 and the output electrode of the fifth inverter transistor TRG17.

Hereinafter, an operation of the second control unit 116 is described in more detail.

The first inverter transistor TRG13 supplies the first low voltage VSS1 to the second node NA in response to the carry signal CRSi-1 of the i-1th stage.

The second inverter transistor TRG14 supplies the second low voltage VSS2 to the second node NA during the ith horizontal section HPi. Accordingly, the first and second holding transistors TRG10 and TRG11 are turned off by the second low voltage VSS2 during the ith horizontal section HPi.

The third inverter transistor TRG15 is turned on during the ith horizontal section HPi, so that the third inverter transistor TRG15 drops the clock signal CKV outputted from the fourth inverter transistor TRG16 to the second low voltage VSS2. Accordingly, the clock signal CKV is not applied (e.g., prevented from being applied) to the second node NA. Herein, the ith horizontal section HPi may correspond to a high section of the clock signal CKV.

The second and third capacitors C2 and C3 are charged by a voltage according to the clock signal CKV. Then, the fifth inverter transistor TRG17 is turned on by the voltage charged to the second and third capacitors C2 and C3. Additionally, when the first to third inverter transistors TRG13, TRG14, and TRG15 are turned off, the potential of the second node NA rises by the voltage charged to the second and third capacitors C2 and C3.

When the potential of the second node NA rises, the first and second holding transistors TRG10 and TRG11 are turned on. The turned-on first holding transistor TRG10 supplies the second low voltage VSS2 to the output terminal OT, and the turned-on second holding transistor TRG11 supplies the first low voltage VSS1 to the carry terminal CR.

Figure 8:
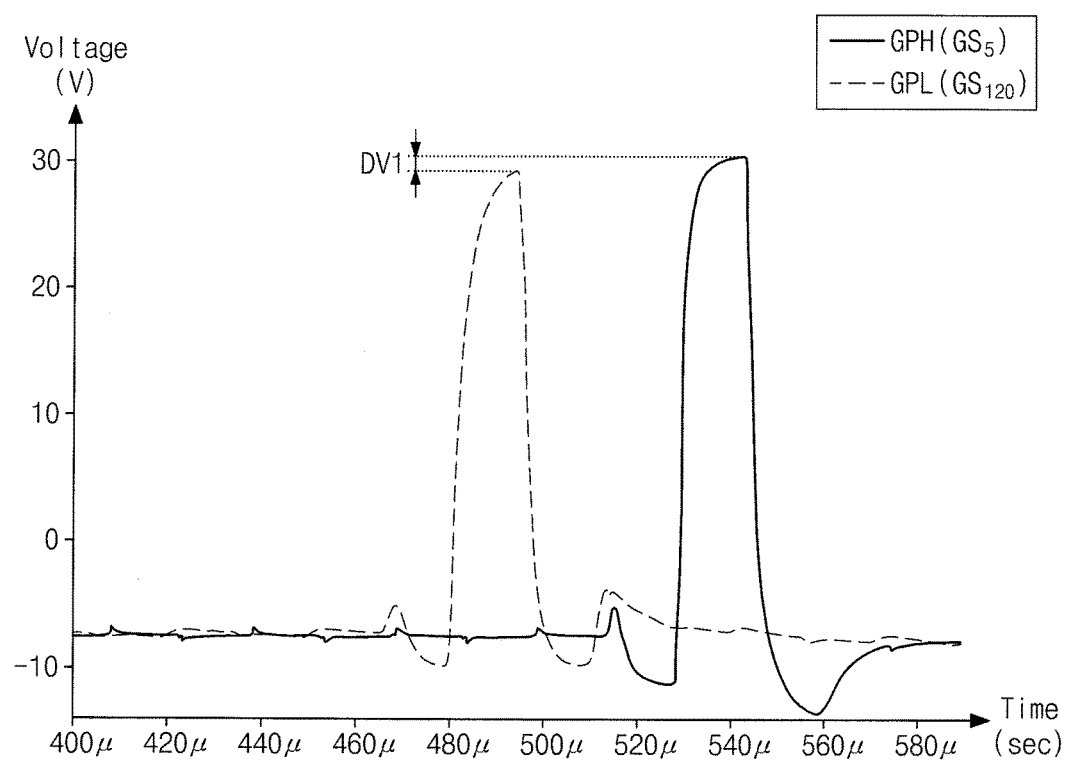
FIG. 8 is a graph for comparing a gate signal outputted from an upper end part of a display device and a gate signal outputted from a lower end part of the display device according to an embodiment of the inventive concept.

FIG. 8 is a graph for comparing a graph GPH of a gate signal outputted from an upper end part of a display device DD and a graph GPL of a gate signal outputted from a lower end part of the display device DD according to an embodiment of the inventive concept.

The graph GPH of the gate signal at the upper end part of the display DD may correspond to the waveform of a gate signal of a fifth stage. The graph GPL of the gate signal at the lower end part of the display DD may correspond to the waveform of a gate signal of a 120th stage.

According to an embodiment of the inventive concept, a difference DV1 (hereinafter referred to as a first deviation) between a peak point of the graph GPH of the gate signal at the upper end part and a peak point of the graph GPL of the gate signal at the lower end part is less than about 1 V. Because the first deviation DV1 is small (e.g., within about 1 V), a defective charging rate may be prevented or substantially prevented between pixels PXnm by a difference of gate signals outputted from the respective upper end and lower end parts of the display device DD.

Figure 9:
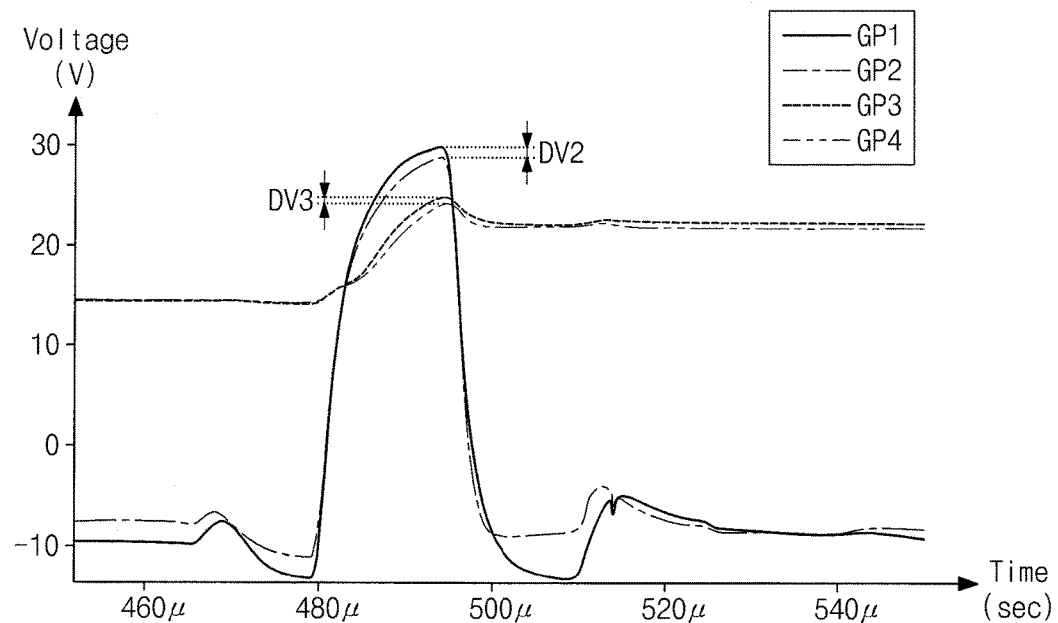
FIG. 9 is a graph for comparing signals outputted from a display device according to an embodiment of the inventive concept with signals outputted from a comparable display device.

FIG. 9 is a graph for comparing graphs GP1 and GP3 of signals outputted from a display device DD according to an embodiment of the inventive concept with graphs GP2 and GP4 of signals outputted from a comparable display device.

The first graph GP1 illustrates a gate signal outputted from the display device DD according to an embodiment of the inventive concept. The second graph GP2 illustrates a gate signal outputted from the comparable display device. The third graph GP3 illustrates a charging voltage of a pixel of the display device DD according to an embodiment of the inventive concept. The fourth graph GP4 illustrates a charging voltage of a pixel of the comparable display device.

A difference DV2 (hereinafter referred to as a second deviation) between the peak point of the first graph GP1 and the peak point of the second graph GP2 represents a difference between a peak point of a gate signal outputted from the display device DD according to an embodiment of the inventive concept and a peak point of a gate signal outputted from the comparable display device Because the peak point of the first graph GP1 is greater by the second difference DV2 than the peak point of the second graph GP2, the peak point of the third graph GP3 is greater by a third deviation DV3 than the peak point of the fourth graph GP4. Each of the second deviation DV2 and the third deviation DV3 may be, for example, about 0.4 V. Accordingly, a charging rate of the pixels PXmn of the display device DD may be improved by about 2.28% compared to a comparable technique.

According to an embodiment of the inventive concept, a speed at which a gate on voltage of a gate signal outputted from a gate driving circuit changes into a gate off voltage becomes faster, so that a charging time may be improved. Additionally, a deviation between gate signals provided to a display panel is reduced. Accordingly, a display device with excellent display quality may be provided.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Although exemplary embodiments of the present invention have been described, it is understood that the present invention should not be limited to these exemplary embodiments, and that various changes and modifications can be made by one having ordinary skill in the art, within the spirit and scope of the present invention as defined by the following claims and their equivalents.

What is claimed is:

1. A gate driving circuit comprising a plurality of stages configured to respectively output gate signals to gate lines and connected to each other in cascade, an ith stage from among the plurality of stages, where i is an integer greater than or equal to two, comprising:
    a first output circuit configured to be turned on/off according to a potential of a first node, and to generate a gate signal from a clock signal received at an input terminal of the ith stage, the gate signal being outputted to a gate output terminal of the ith stage and including a gate on voltage and a gate off voltage;
    a first control circuit configured to control the potential of the first node;
    a first pull-down circuit configured to provide a first low voltage to the gate output terminal of the ith stage to drop down the gate signal of the ith stage, after the gate on voltage of the gate signal of the ith stage is outputted, the first low voltage being lower than the gate off voltage of the gate signal of the ith stage;
    a first holding circuit and a stabilization circuit, each configured to provide a second low voltage having a higher level than that of the first low voltage to the gate output terminal of the ith stage, after the first low voltage is provided to the gate output terminal of the ith stage; and
    a second control circuit configured to control an operation of the first holding circuit,
    wherein the first pull-down circuit comprises a first pull-down transistor, and the first pull-down transistor comprises a control electrode configured to receive an output signal of an i+1th stage, an input electrode configured to receive the first low voltage, and an output electrode connected to the gate output terminal.

2. The gate driving circuit of claim 1, wherein the first holding circuit comprises:
a first holding transistor,
wherein the first holding transistor comprises a control electrode connected to a second node and configured to receive an inverter signal generated based on the clock signal from the second control circuit, an input electrode configured to receive the second low voltage, and an output electrode connected to the gate output terminal.

3. The gate driving circuit of claim 1, wherein the stabilization circuit comprises:
a stabilization transistor,
wherein the stabilization transistor comprises a control electrode configured to receive an output signal of an i+2th stage, an input electrode configured to receive the second low voltage, and an output electrode connected to the gate output terminal.

4. The gate driving circuit of claim 1, wherein:
the first low voltage is more than about −15 V and less than about −10 V; and
the second low voltage is more than about −9V and less than about −6 V.

5. The gate driving circuit of claim 4, wherein the gate off voltage has the same level as that of the first low voltage.

6. The gate driving circuit of claim 5, further comprising a second output circuit configured to be turned on or off according to a potential of the first node, and to generate a carry signal to be outputted to a carry output terminal of the ith stage from a clock signal received at the input terminal of the ith stage.

7. The gate driving circuit of claim 6, further comprises a second pull-down circuit configured to provide the first low voltage to the carry output terminal of the ith stage after the carry signal is outputted,
wherein the second pull-down circuit comprises a second pull-down transistor.

8. The gate driving circuit of claim 7, further comprising a second holding circuit configured to maintain the carry output terminal of the ith stage at the first low voltage after the first low voltage is provided to the carry output terminal of the ith stage,
wherein the second holding circuit comprises a second holding transistor.

9. A display device comprising:
a display panel comprising a plurality of gate lines, a plurality of data lines crossing and insulated from the plurality of gate lines, and a plurality of pixels respectively connected to the gate lines and the data lines;
a data driver configured to provide data signals to the plurality of data lines; and
a gate driver comprising a plurality of stages connected in cascade with each other and configured to provide gate signals to the plurality of gate lines,
wherein an ith stage from among the plurality of stages, where i is an integer greater than or equal to two, comprises:
a first output circuit configured to be turned on/off according to a potential of a first node, and to generate a gate signal from a clock signal received at an input terminal of the ith stage, the gate signal being outputted to a gate output terminal of the ith stage and including a gate on voltage and a gate off voltage;
a first control circuit configured to control the potential of the first node;
a first pull-down circuit configured to provide a first low voltage to the gate output terminal of the ith stage to drop down the gate signal of the ith stage, after the gate on voltage of the gate signal of the ith stage is outputted, the first low voltage being lower than the gate off voltage of the gate signal of the ith stage;
a first holding circuit and a stabilization circuit, each configured to provide a second low voltage having a higher level than that of the first low voltage to the gate output terminal of the ith stage, after the first low voltage is provided to the gate output terminal of the ith stage; and
a second control circuit configured to control an operation of the first holding circuit,
wherein the first pull-down circuit comprises a first pull-down transistor, and the first pull-down transistor comprises a control electrode configured to receive an output signal of an i+1th stage, an input electrode configured to receive the first low voltage, and an output electrode connected to the gate output terminal.

10. The display device of claim 9, wherein at least one pixel from among the plurality of pixels comprises:
a pixel transistor connected to a corresponding gate line and a corresponding data line;
a pixel electrode connected to the pixel transistor; and
a common electrode opposite the pixel electrode with a liquid crystal layer there between,
wherein the pixel electrode and the common electrode form a liquid crystal capacitor configured to be charged with a data voltage received from the pixel transistor.

11. The display device of claim 10, wherein the data voltage is a voltage corresponding to a gray level value of a corresponding data signal applied to the corresponding data line within a range of about −8 V to about 35 V.

12. The display device of claim 9, wherein the first holding circuit comprises a holding transistor,
wherein the holding transistor comprises a control electrode connected to a second node configured to receive an inverter signal generated based on the clock signal from the second control circuit, an input electrode configured to receive the second low voltage, and an output electrode connected to the gate output terminal.

13. The display device of claim 9, wherein the stabilization circuit comprises a stabilization transistor,
wherein the stabilization transistor comprises a control electrode configured to receive an output signal of an i+2th stage, an input electrode configured to receive the second low voltage, and an output electrode connected to the gate output terminal.

14. The display device of claim 9, wherein:
the first low voltage is more than about −15 V and less than about −10 V; and
the second low voltage is more than about −9V and less than about −6 V.

15. The display device of claim 14, wherein the gate off voltage has the same level as that of the first low voltage.

16. A gate driving circuit comprising a plurality of stages configured to respectively output gate signals to gate lines and connected in cascade with each other, an ith stage from among the plurality of stages, where i is an integer greater than or equal to two, comprising:

an output transistor comprising a control electrode connected to a first node, an input electrode configured to receive a clock signal, and an output electrode connected to an output terminal;

a control transistor comprising a control electrode configured to receive an output of an i−1th stage, an input electrode connected to the control electrode, and an output electrode connected to the first node;

a pull-down transistor comprising a control electrode configured to receive an output signal of an i+1th stage, an input electrode configured to receive a first low voltage, and an output electrode connected to the output terminal;

a holding transistor comprising a control electrode connected to a second node, an input electrode configured to receive a second low voltage having a higher level than that of the first low voltage, and an output electrode connected to the output terminal; and a stabilization transistor comprising a control electrode configured to receive an output signal of an i+2th stage, an input electrode configured to receive the second low voltage, and an output electrode connected directly to the output terminal.

17. The gate driving circuit of claim 16, wherein the output terminal is configured to output a gate signal including a gate on voltage and a gate off voltage, and wherein the gate driving circuit further comprises an inverter transistor configured to maintain the second node at the gate off voltage when the gate signal is the gate on voltage.

18. The gate driving circuit of claim 16, further comprising a capacitor connected between the first node and the output terminal.

* * * * *